US008169138B2

(12) United States Patent
Lee

(10) Patent No.: US 8,169,138 B2
(45) Date of Patent: *May 1, 2012

(54) ORGANIC LIGHT EMITTING DIODE DISPLAY INCLUDING A DRIVING VOLTAGE LINE AND METHOD FOR MANUFACTURING THE SAME

(75) Inventor: Baek-Woon Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 293 days.

This patent is subject to a terminal disclaimer.

(21) Appl. No.: 12/260,015

(22) Filed: Oct. 28, 2008

(65) Prior Publication Data

US 2009/0128018 A1 May 21, 2009

(30) Foreign Application Priority Data

Nov. 16, 2007 (KR) .................... 10-2007-0117379

(51) Int. Cl.
*H01J 1/62* (2006.01)
(52) U.S. Cl. .................................................. 313/505
(58) Field of Classification Search .......... 313/503; 345/30, 36, 44, 45, 76, 80; 315/169.1, 169.3
See application file for complete search history.

(56) References Cited

U.S. PATENT DOCUMENTS

| 7,102,293 | B2 | 9/2006 | Matsumoto |
| 7,202,841 | B2 * | 4/2007 | Matsumoto ...................... 345/76 |
| 2005/0093789 | A1 * | 5/2005 | Kim et al. ........................ 345/76 |
| 2005/0179374 | A1 * | 8/2005 | Kwak ............................ 313/506 |
| 2005/0242745 | A1 * | 11/2005 | Jung .............................. 313/495 |
| 2007/0120126 | A1 * | 5/2007 | Sung et al. ...................... 257/59 |
| 2009/0121982 | A1 * | 5/2009 | Choi et al. .................... 313/504 |
| 2009/0207108 | A1 * | 8/2009 | Jung et al. ...................... 345/80 |

FOREIGN PATENT DOCUMENTS

| JP | 2005-108528 | 4/2005 |
| JP | 2006-154495 | 6/2006 |
| KR | 2005-0041076 | 5/2005 |
| KR | 2005-0081540 | 8/2005 |
| KR | 2005-0104955 | 11/2005 |
| KR | 2006-0099995 | 9/2006 |
| KR | 2007-0056304 | 6/2007 |

* cited by examiner

*Primary Examiner* — Peter Macchiarolo
(74) *Attorney, Agent, or Firm* — Innovation Counsel LLP

(57) ABSTRACT

The present invention relates to an OLED display and a manufacturing method thereof, including a gate line, a data line intersecting the gate line, a switching thin film transistor connected to the gate line and the data line, a driving thin film transistor connected to the switching thin film transistor, a first driving voltage line connected to the driving thin film transistor and overlapping the gate line and the data line, a first electrode connected to the driving thin film transistor, a second electrode facing the first electrode, and an light emitting member disposed between the first electrode and the second electrode.

20 Claims, 18 Drawing Sheets

ORGANIC LIGHT EMITTING DIODE DISPLAY INCLUDING A DRIVING VOLTAGE LINE AND METHOD FOR MANUFACTURING THE SAME

CROSS-REFERENCE TO RELATED APPLICATION

This application claims priority under 35 U.S.C. §119 to Korean Patent Application No. 10-2007-0117379 filed in the Korean Intellectual Property Office on Nov. 16, 2007, the contents of which are incorporated herein by reference in their entirety.

BACKGROUND OF THE INVENTION (a) Field of the Invention

The present invention relates to an organic light emitting device and a manufacturing method thereof.

(b) Description of the Related Art

Trends toward lightweight and thin personal computers and televisions sets also require lightweight and thin display devices, and flat panel displays such as a liquid crystal display (LCD) satisfying such requirements are being substituted for conventional cathode ray tubes (CRTs).

However, because the LCD is a passive display device, an additional back-light as a light source is needed, and the LCD has various problems such as a slow response time and a narrow viewing angle.

Among the flat panel displays, an organic light emitting diode display (OLED display) has recently been the most promising as a display device for solving these problems.

The OLED display includes two electrodes and an organic light emitting layer interposed between the two electrodes. One of the two electrodes injects holes and the other injects electrons into the light emitting layer. The injected electrons and holes are combined to form excitons and the excitons emit light as release energy.

Because the OLED display is a self-emissive display device, an additional light source is not necessary such that the OLED display has lower power consumption as well as a high response speed, wide viewing angle, and high contrast ratio.

The OLED display may be classified as a passive matrix OLED display and an active matrix OLED display according to driving type.

In the active OLED display, an electrode and an emission layer are disposed on a thin film transistor array panel, and the thin film transistor array panel includes driving voltage lines for transmitting a driving voltage as well as signal lines such as gate lines and data lines.

However, the driving voltage lines must be isolated from the gate lines and the data lines, because if the driving voltage lines are disposed close to the gate lines or data lines, a signal delay of the gate lines or data lines may be generated.

To prevent this, each driving voltage line may be formed with a uniform interval from the gate line and data line, but the area that the gate lines, the data lines, and the driving voltage lines occupies is thereby increased such that the aperture ratio may be remarkably reduced.

Also, the driving voltage lines may become disconnected due to steps at an area where the driving voltage lines intersect the gate lines or the data lines.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention is to prevent the disconnection of the signal lines without incurring a reduction of the aperture ratio or a signal delay.

An OLED display according to an exemplary embodiment of the present invention includes a gate line, a data line intersecting the gate line, a switching thin film transistor connected to the gate line and the data line, a driving thin film transistor connected to the switching thin film transistor, a first driving voltage line connected to the driving thin film transistor and overlapping the gate line and the data line, a first electrode connected to the driving thin film transistor, a second electrode facing the first electrode, and an light emitting member disposed between the first electrode and the second electrode.

The first driving voltage line may include a first layer disposed with the same layer as the first electrode.

The first layer of the first driving voltage line and the first electrode may include a transparent conductive material.

The first driving voltage line may further include a second layer disposed on or under the first layer, and includes a metal.

The OLED display may further include an organic insulating layer formed between the gate line and data line, and the first driving voltage line.

The OLED display may further include a second driving voltage line formed with the same layer as at least one of the gate line and the data line, and is connected to the first driving voltage line.

The first driving voltage line may include a transparent conductive material and is disposed with the same layer as the first electrode, and the second driving voltage line may include a metal.

The first driving voltage line has a mesh shape.

An OLED display according to another exemplary embodiment of the present invention includes a first signal line formed on a substrate, a gate insulating layer formed on the first signal line, a second signal line formed on the gate insulating layer and intersecting the first signal line, an organic insulating layer formed on the second signal line, a first electrode and a first driving voltage line formed on the organic insulating layer and including a transparent conductive layer, a light emitting member formed on the first electrode, and a second electrode formed on the light emitting member.

The first driving voltage line may overlap the first signal line and the second signal line.

The first driving voltage line may further include a metal layer formed on or under the transparent conductive layer.

The first driving voltage line has a mesh shape.

The OLED display may further include a second driving voltage line formed with the same layer as at least one of the first signal line and the second signal line, and is connected to the first driving voltage line.

The second driving voltage line may include a metal layer.

An OLED display according to the present invention includes a first signal line and a second signal line intersecting to each other, a first control electrode connected to the first signal line, a first semiconductor overlapping the first control electrode, a first input electrode connected to the second signal line, a first output electrode facing the first input electrode, a second control electrode connected to the first output electrode, a second semiconductor overlapping the second control electrode, a second input electrode overlapping the second semiconductor, a second output electrode overlapping the second semiconductor and facing the second input electrode, a third signal line overlapping the first signal line and the second signal line and connected to the second input electrode, a first electrode connected to the second output electrode, a second electrode facing the first electrode, and a light emitting member disposed between the first electrode and the second electrode.

The OLED display may further include an organic insulating layer disposed between the first signal line and second signal line, and the third signal line.

The third signal line may further include a transparent conductive layer formed with the same layer as the first electrode.

The OLED display may further include a metal layer formed on or under the transparent conductive layer.

The first semiconductor and the second semiconductor may include different crystalline states.

The first semiconductor may include amorphous silicon, and the second semiconductor may include crystalline silicon.

The first control electrode may be disposed under the first semiconductor, and the second control electrode may be disposed on the second semiconductor.

A manufacturing method of an OLED display according to an exemplary embodiment of the present invention includes forming a first signal line on a substrate, forming a second signal line intersecting the first signal line, forming an organic insulating layer on the second signal line, and forming a third signal line overlapping the first and second signal lines and a pixel electrode separated from the third signal line on the organic insulating layer.

The forming of the third signal line and the pixel electrode may include sequentially depositing a transparent conductive layer and a metal layer on the organic insulating layer, and partially maintaining the metal layer to form a first portion and a second portion, wherein the first portion is where the metal layer is maintained and the second portion is where the metal layer is removed and the transparent conductive layer is exposed.

The partial removing of the metal layer may be performed using a photoresist pattern having different thicknesses.

The forming of the third signal line and the pixel electrode may include depositing a metal layer on the organic insulating layer, patterning the metal layer by photolithography to form a plurality of metal patterns, depositing a transparent conductive layer on the metal patterns and the organic insulating layer, and patterning the transparent conductive layer by photolithography to form a first transparent conductive pattern disposed on the metal patterns and a second transparent conductive pattern disposed on the organic insulating layer.

Accordingly, the driving voltage lines overlap the gate lines and the data lines such that the emission area may be increased by an amount of an area that the driving voltage lines occupy, thereby increasing the aperture ratio.

Also, the driving voltage lines are not neighboring the gate lines and the data lines, and are vertically departed therefrom via the passivation layer made of organic insulator such that mutual influences between the gate voltages, the data voltages, and the driving voltages are decreased, thereby preventing the signal delay.

In addition, the driving voltage lines do not intercept the gate lines or the data lines and are disposed on the planer surface of the passivation layer such that disconnection due to the steps may be reduced.

Further, the driving voltage line is formed with the same layer as the pixel electrode and is a mesh shape covering the gate line and the data line such that the cross talk that the pixel electrode is influenced by the voltage of the gate line or the data line may be reduced.

Still further, the driving voltage lines are made of the low resistance metal such that the signal delay due to the wire resistance may be prevented in an organic light emitting device of a large size.

DESCRIPTION OF REFERENCE NUMERALS INDICATING PRIMARY ELEMENTS IN THE DRAWINGS

Figure 1:
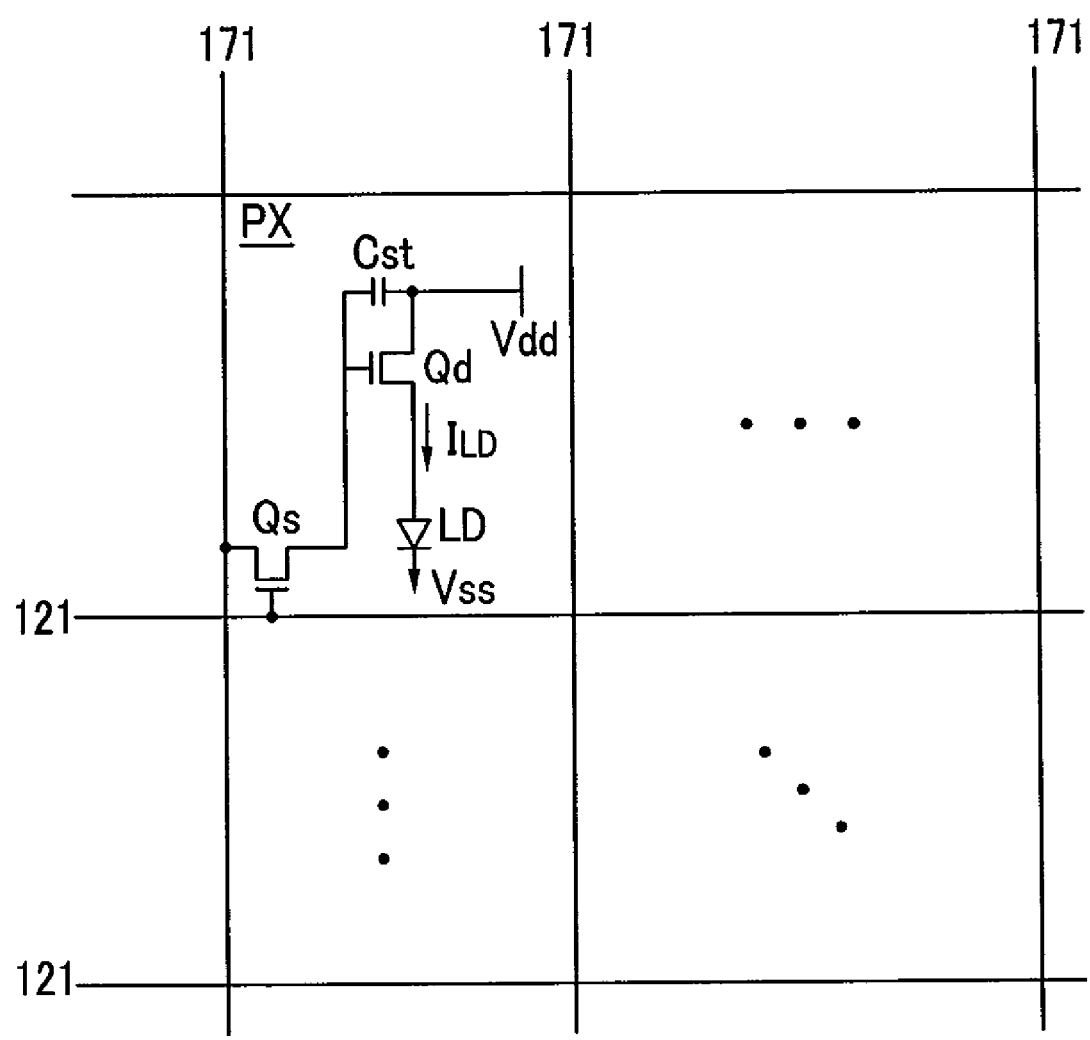
FIG. 1 is an equivalent circuit diagram of an OLED display according to an exemplary embodiment of the present invention.

| | |
|---|---|
| 110: | insulating substrate |
| 121: | gate line |
| 124a: | switching control electrode |
| 124b: | driving control electrode |
| 140: | gate insulating layer |
| 154a: | switching semiconductor |
| 154b: | driving semiconductor |
| 127, 177: | storage electrode |
| 163a, 163b, 165a, 165b: | ohmic contact |
| 171: | data line |
| 172, 192: | driving voltage line |
| 173a: | switching input electrode |
| 173b: | driving input electrode |
| 175a: | switching output electrode |
| 175b: | driving output electrode |
| 180: | passivation layer |
| 191: | pixel electrode |
| 184, 185a, 185b, 186: | contact hole |
| 270: | common electrode |
| 365: | opening |
| 361: | organic insulator |
| 370: | organic light emitting member |
| 85: | connecting member |
| Vdd: | driving voltage |
| Qs: | switching transistor |
| Qd: | driving transistor |
| LD: | organic light emitting diode |
| Vss: | common voltage |
| Cst: | storage capacitor |

DETAILED DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Exemplary Embodiment 1

Now, an OLED display according to an embodiment of the present invention will be described in detail with reference to FIG. 1.

FIG. 1 is an equivalent circuit diagram of an OLED display according to an exemplary embodiment of the present invention.

Referring to FIG. 1, an OLED display according to the present exemplary embodiment includes a plurality of signal lines 121, 171, and 172, and a plurality of pixels PX connected thereto and arranged substantially in a matrix.

The signal lines include a plurality of gate lines 121 for transmitting gate signals (or scanning signals), a plurality of data lines 171 for transmitting data signals, and a plurality of driving voltage lines (not shown) for transmitting a driving voltage Vdd. The gate lines 121 extend substantially in a row direction and substantially parallel to each other, and the data lines 171 and the driving voltage lines 172 extend substantially in a column direction and substantially parallel to each other. The driving voltage lines are not shown in the drawing, but include transverse portions (not shown) extended in a direction parallel to the gate lines 121 and vertical portions extended to the direction parallel to the data lines 171, and will be described in detail later.

Each pixel PX includes a switching thin film transistor Qs, a driving thin film transistor Qd, a storage capacitor Cst, and an organic light emitting diode LD.

The switching transistor Qs has a control terminal connected to one of the gate lines 121, an input terminal connected to one of the data lines 171, and an output terminal connected to the driving transistor Qd. The switching transistor Qs transmits the data signals applied to the data line 171 to the driving transistor Qd in response to a gate signal applied to the gate line 121.

The driving transistor Qd has a control terminal connected to the switching transistor Qs, an input terminal connected to the driving voltage line 172, and an output terminal connected to the organic light emitting diode LD. The driving transistor Qd drives an output current ILD having a magnitude depending on the voltage between the control terminal and the output terminal thereof, and outputs it to the organic light emitting diode LD.

The capacitor Cst is connected between the control terminal and the input terminal of the driving transistor Qd. The capacitor Cst stores a data signal applied to the control terminal of the driving transistor Qd and maintains the data signal after the switching transistor Qs turns off.

The organic light emitting diode LD has an anode connected to the output terminal of the driving transistor Qd and a cathode connected to a common voltage Vss. The organic light emitting diode LD emits light having an intensity depending on an output current ILD of the driving transistor Qd, thereby displaying images.

The switching transistor Qs and the driving transistor Qd are n-channel field effect transistors (FETs). However, at least one of the switching transistor Qs and the driving transistor Qd may be a p-channel FET. In addition, the connections among the transistors Qs and Qd, the capacitor Cst, and the organic light emitting diode LD may be modified.

Now, the OLED display shown in FIG. 1 will be described in detail with reference to FIG. 2 and FIG. 3 as well as FIG. 1.

Figure 2:
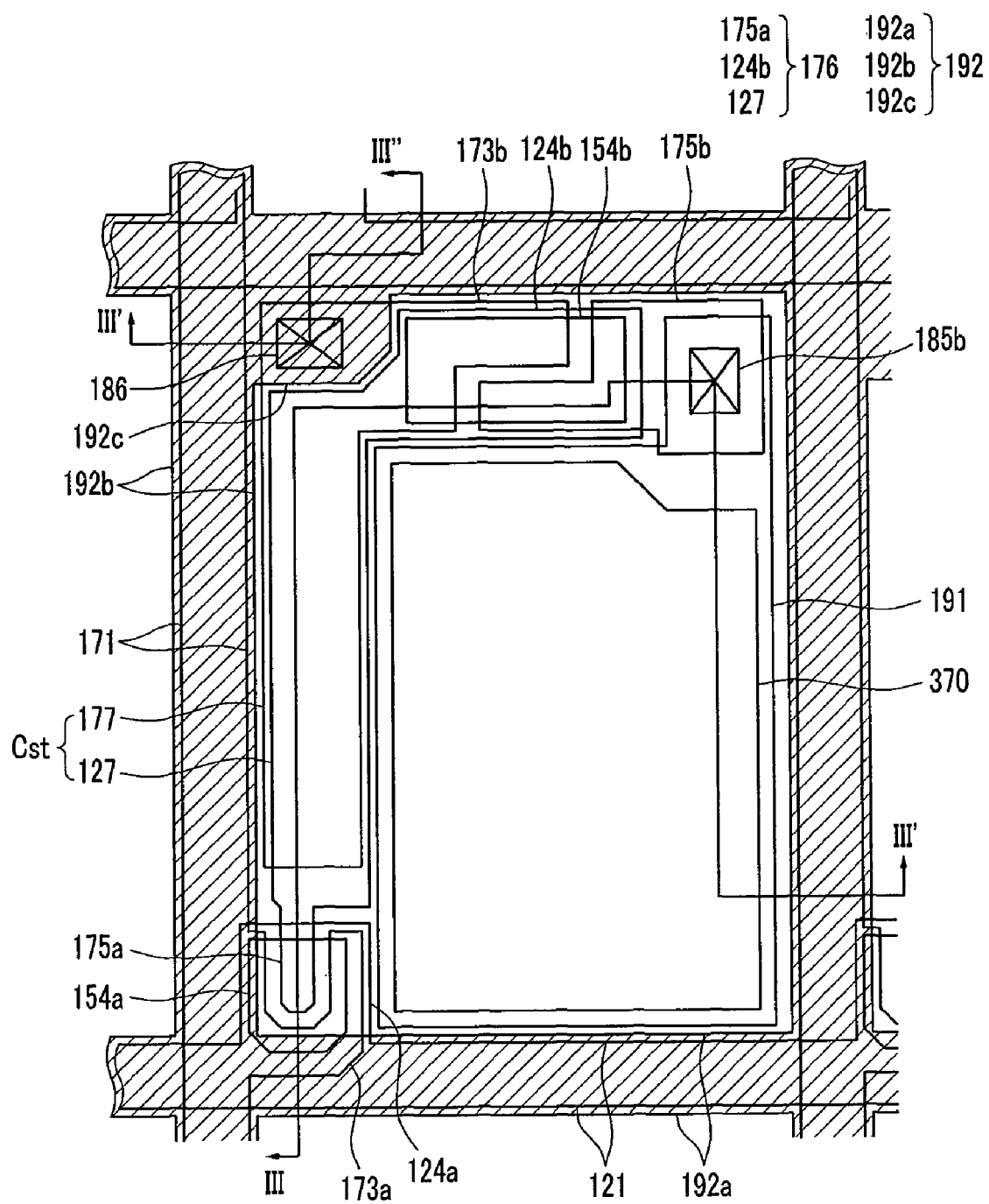
FIG. 2 is a layout view of an OLED display according to an exemplary embodiment of the present invention.
Figure 3:
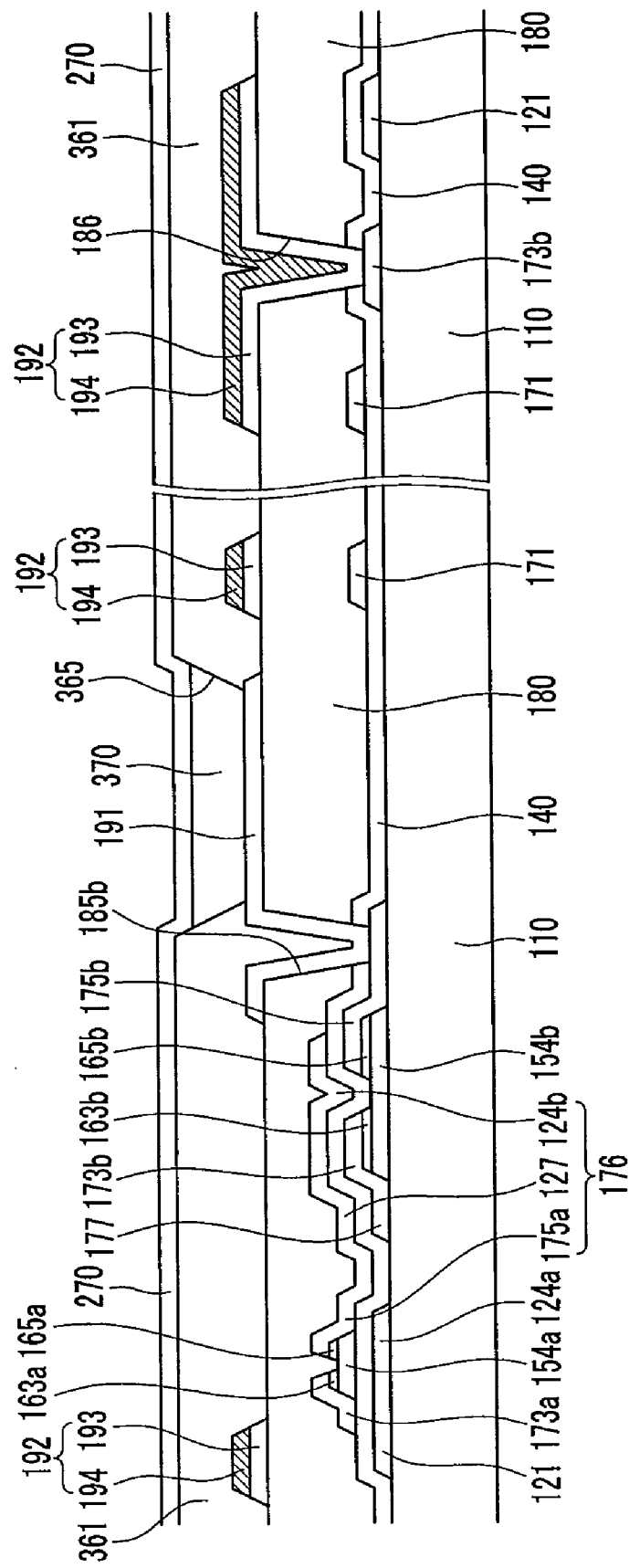
FIG. 3 is a cross-sectional view of the OLED display shown in FIG. 2 taken along the line III-III'-III"

FIG. 2 is a layout view of an OLED display according to an exemplary embodiment of the present invention, and FIG. 3 is a cross-sectional view of the OLED display shown in FIG. 2 taken along the line III-III'-III".

A plurality of driving semiconductors 154b are formed on an insulating substrate 110 made of a material such as transparent glass or plastic. The driving semiconductors 154b have an island shape, and may be made of a crystalline semiconductor material such as microcrystalline silicon or polycrystalline silicon.

A plurality of gate lines 121, a plurality of driving input electrodes 173b and a plurality of driving output electrodes 175b are formed on the substrate 110 and the driving semiconductors 154b.

The gate lines 121 are extended in the horizontal direction and include a plurality of switching control electrodes 124a extending in the upward direction.

The driving input electrodes 173b and the driving output electrodes 175b respectively have an island shape and are opposite to each other on the driving semiconductors 154b. The driving input electrodes 173b include a plurality of lower storage electrodes 177 extending in the vertical direction.

A plurality of pairs of ohmic contacts 163b and 165b are formed between the driving semiconductors 154b and the driving input electrodes 173b, and the driving semiconductors 154b and the driving output electrodes 175b, respectively. The ohmic contacts 163b and 165b are preferably made of a semiconductor material such as amorphous silicon, microcrystalline silicon or polycrystalline silicon doped with an n-type impurity such as phosphorous.

A gate insulating layer 140 preferably made of silicon nitride ($SiN_x$) or silicon oxide ($SiO_2$) is formed on the gate lines 121, the driving input electrodes 173b, and the driving output electrodes 175b.

A plurality of switching semiconductors 154a preferably made of hydrogenated amorphous silicon are formed on the gate insulating layer 140. The switching semiconductors 154a have an island shape and overlap the switching control electrodes 124a.

A plurality of data lines 171 and a plurality of electrode members 176 are formed on the gate insulating layer 140 and the switching semiconductors 154a.

The data lines 171 are extended in the vertical direction and intersect the gate lines 121, and each data line 171 includes a plurality of switching input electrodes 173a extending toward the switching control electrode 124a with curved portions such as a "U" shape. However, the switching input electrodes 173a may be variously changed.

The electrode members 176 have an island shape, and respectively include a switching output electrode 175a, an upper storage electrode 127, and a driving control electrode 124b.

The switching output electrodes 175a are opposite to the switching input electrodes 173a on the switching semiconductors 154a, and portions of the switching output electrodes 175a are enclosed by the curved portions of the switching input electrodes 173a.

The upper storage electrodes 127 are extended from the switching output electrodes 175b, and overlap the lower storage electrodes 177 to form storage capacitors Cst.

The driving control electrodes 124b overlap the driving semiconductors 154b.

A plurality of pairs of ohmic contacts 163a and 165a are formed between the switching semiconductors 154a and the switching input electrodes 173a, and the switching semiconductors 154a and the switching output electrodes 175a.

A passivation layer 180 is formed on the data lines 171 and the electrode members 176. The passivation layer 180 and the gate insulating layer 140 have a plurality of contact holes 186 and 185b respectively exposing the driving input electrodes 173b and the driving output electrodes 175b. It is preferable that the passivation layer 180 is made of an organic material having a low dielectric ratio and a thickness of about 2 to 4 µm.

A plurality of pixel electrodes 191 and a plurality of driving voltage lines 192 are formed on the passivation layer 180.

The pixel electrodes 191 are connected to the driving output electrodes 175b through the contact holes 185b, and may be made of a transparent conductor such as ITO or IZO.

As shown in FIG. 2, the driving voltage lines 192 include horizontal portions 192a extending along the gate lines 121 and overlapping the gate lines 121, vertical portions 192b extending along the data lines 171 overlapping the data lines 171, and connection portions 192c protruding from the horizontal portions 192a and the vertical portions 192b. In the drawing, the driving voltage lines 192 including the horizontal portions 192a, the vertical portions 192b, and the connection portions 192c are hatched.

The plurality of horizontal portions 192a and the plurality of vertical portions 192b intersect such that a mesh shape is formed. The connection portions 192c are connected to the driving input electrodes 173b through the contact holes 186.

The driving voltage lines 192 transmit driving voltages, and the driving voltages are transmitted to the driving input electrodes 173b through the contact holes 186.

In the exemplary embodiment of the present invention, the driving voltage lines 192 have the mesh shape overlapping the gate lines 121 and the data lines 171 such that the emission area may be increased by an amount of an area that the driving voltage lines 192 occupy, thereby increasing the aperture ratio.

Also, the driving voltage lines 192 do not directly neighbor the gate lines 121 and the data lines 171, and are vertically departed therefrom via the passivation layer 180 made of organic insulator such that the mutual influences between the gate voltages, the data voltages, and the driving voltages are decreased, thereby preventing the signal delay.

Also, the driving voltage lines 192 are formed with the same layer as the pixel electrodes 191 and cover the gate lines 121 and the data lines 171 such that cross talk in which the pixel electrodes 191 are influenced by the voltages of the gate lines 121 or the data lines 171 may be reduced.

Also, the driving voltage lines 192 are disposed on the planer surface of the passivation layer and do not intersect the gate lines 121 or the data lines 171 such that the disconnections due to the steps may be reduced.

As shown in FIG. 3, the driving voltage lines 192 also include an upper layer 194 and a lower layer 193 that are made of different materials. The lower layer 193 is formed at the same layer as the pixel electrodes 191, and may be made of the transparent conductor such as ITO or IZO. The upper layer 194 may be made of a low resistance metal such as an aluminum-containing metal of aluminum (Al) or an aluminum alloy, a silver-containing metal of silver (Ag) or a silver alloy, and a copper-containing metal of copper (Cu) and a copper alloy. However, the lower layer 193 may be made of the low resistance metal and the upper layer 194 may be made of the transparent conductor.

As above-described, the driving voltage lines 192 include the lower layer 193 formed with the same layer as the pixel electrodes 191 and the upper layer 194 made of the low resistance metal such that a signal delay due to the wire resistance may be reduced in a OLED display with a large size. In the OLED display with a small size and having a low signal delay, the upper layer 194 made of the low resistance metal may be omitted.

An insulating layer 361 including a plurality of openings 365 exposing the pixel electrodes 191 is formed on the pixel electrodes 191 and the driving voltage lines 192.

A plurality of organic light emitting members 370 are formed in the openings 365. The organic light emitting members 370 may be made of a multi-layered structure including an auxiliary layer (not shown) for improving light emitting efficiency as well as an emitting layer (not shown) for emitting light.

The emission layer may be formed of a high-molecular-weight material, a low-molecular-weight material, or a mixture thereof that uniquely emits light of one of three primary colors, such as red, green, and blue.

The auxiliary layer may include at least one selected from an electron transport layer (not shown) and a hole transport layer (not shown) that achieve a balance of electrons and holes, and an electron injection layer (not shown) and a hole injection layer (not shown) that reinforce the injection of the electrons and the holes.

The light emitting members 370 uniquely emitting light of one of primary colors such as red, green, and blue are preferably respectively arranged in each pixel, and the light emitting members 370 emitting light of three colors such as red, green, and blue may all be arranged in one pixel with vertical or horizontal deposition to form a white emitting layer under or above the color filters emitting light of one of the primary colors such as red, green, and blue.

A common electrode 270 is formed on the organic light emitting members 370 and the insulating layer 361. The common electrode 270 is formed on the whole surface of the substrate, and may be made of an opaque conductor such Au, Pt, Ni, Cu, W, or an alloy thereof.

The common electrode 270 supplies current to the light emitting members 370 in cooperation with the pixel electrodes 191.

In the above-described OLED display, the switching control electrode 124a electrically connected to the gate line 121, the switching input electrode 173a electrically connected to the data line 171, and the switching output electrode 175a form the switching thin film transistor Qs along with the switching semiconductor 154a, and a channel of the switching thin film transistor Qs is formed in the switching semiconductor 154a between the switching input electrode 173a and the switching output electrode 175a.

The driving control electrode 124b electrically connected to the switching output electrode 175a, the driving input electrode 173b electrically connected to the driving voltage line 192, the driving output electrode 175b connected to the pixel electrode 191, and the driving semiconductor 154b form the driving thin film transistor Qd, and a channel of the driving thin film transistor Qd is formed in the driving semiconductor 154b between the driving input electrode 173b and the driving output electrode 175b.

As above-described, the switching semiconductors 154a are made of the amorphous silicon and the driving semiconductor 154b are made of crystalline semiconductor. That is to say, the present exemplary embodiment is a hybrid structure in which the channels of the switching thin film transistor and the driving thin film transistor are respectively formed in the amorphous semiconductor and the crystalline semiconductor. In this hybrid structure, an off current of the switching thin film transistor is reduced to thereby prevent the loss of the data voltages, and the driving thin film transistor may flow a sufficient current to the organic light emitting device due to high carrier mobility and stability, thereby improving the brightness of the OLED. Accordingly, the characteristics respectively required in the switching thin film transistor and the driving thin film transistor may be simultaneously satisfied.

A pixel electrode 191, an organic light emitting member 370, and the common electrode 270 form an organic light emitting diode LD having the pixel electrode 191 as an anode and the common electrode 270 as a cathode, or vice versa.

In the present exemplary embodiment, the bottom emission type including the pixel electrode made of the transparent conductor and the common electrode made of the opaque conductor is explained, but the present invention may be adapted to a top emission type including a common electrode made of the transparent conductor and a pixel electrode made of the opaque conductor.

Now, a method of manufacturing the OLED display shown in FIGS. 2 and 3 is described with reference to FIGS. 4 to 14 as well as FIGS. 2 and 3.

FIG. 4 to FIG. 14 are cross sectional views sequentially showing processes of manufacturing the OLED display shown in FIG. 2 and FIG. 3 according to an exemplary embodiment of the present invention.

Figure 4:
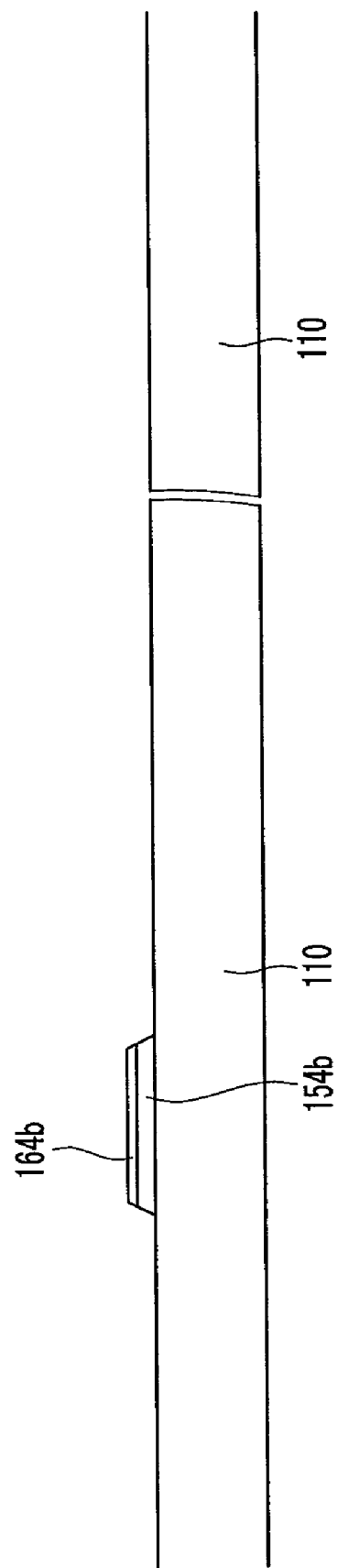
FIGS. 4-14 are cross-sectional views sequentially showing processes of manufacturing the OLED display shown in FIG. 2 and FIG. 3 according to exemplary embodiments of the present invention.

Referring to FIG. 4, an amorphous silicon layer and an impurity amorphous silicon layer are sequentially deposited on a substrate 110, and are crystallized. For the crystallization, solid phase crystallization (SPC), rapid thermal annealing (RTA), liquid phase recrystallization (LPR), or excimer laser annealing (ELA) may be used, and it is preferable that the solid phase crystallization is used because of its ease in crystallization of a large area.

Next, the crystallized silicon layer and the impurity silicon layer are patterned by photolithography to form a plurality of driving semiconductors 154b and a plurality of ohmic contact layers 164b with an island shape.

Figure 5:
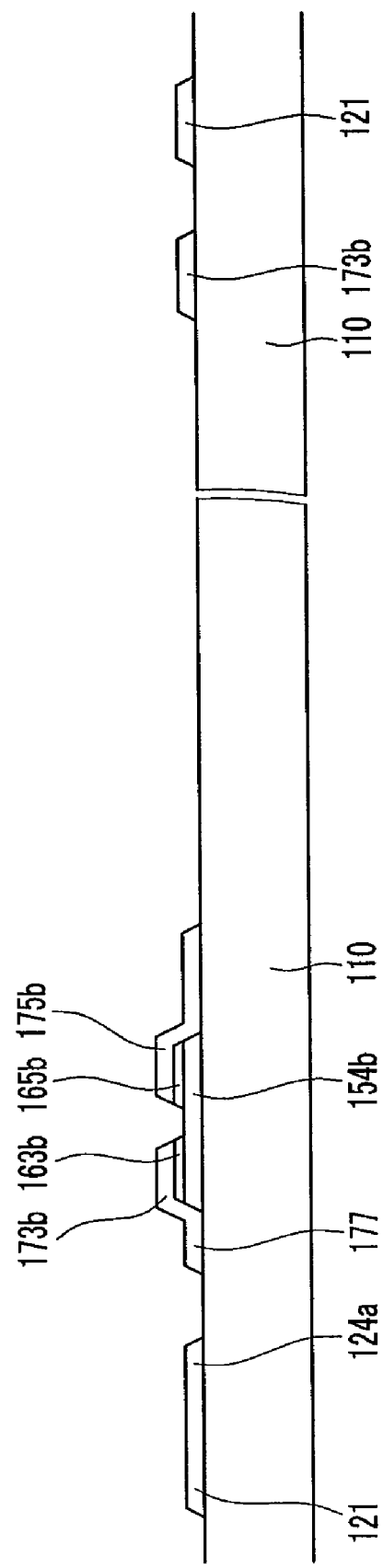

Next, referring to FIG. 5, a metal layer is deposited on the ohmic contact layers 164b and the substrate 110, and is patterned by photolithography to form a plurality of gate lines 121 including a plurality of switching control electrodes 124a, a plurality of driving input electrodes 173b including storage electrodes 177, and a plurality of driving output electrodes 175b.

Next, the ohmic contact layers 164b are etched by using the driving input electrodes 173b and the driving output electrodes 175b as an etch mask to form a plurality of pairs of ohmic contacts 163b and 165b.

Figure 6:
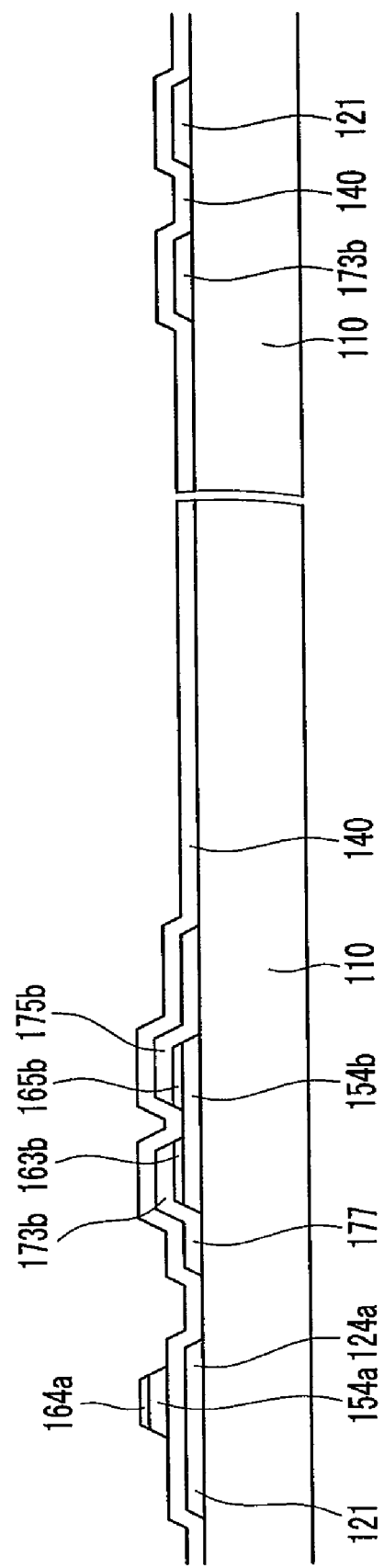

Next, referring to FIG. 6, a gate insulating layer 140, an amorphous silicon layer (not shown), and an impurity amorphous silicon layer (not shown) are sequentially deposited on the gate lines 121, the driving input electrodes 173b, the driving output electrodes 175b, and the substrate 110, and the amorphous silicon layer and the impurity amorphous silicon layer are patterned to form a plurality of switching semiconductors 154a and a plurality of ohmic contact layers 164a with an island shape.

Figure 7:
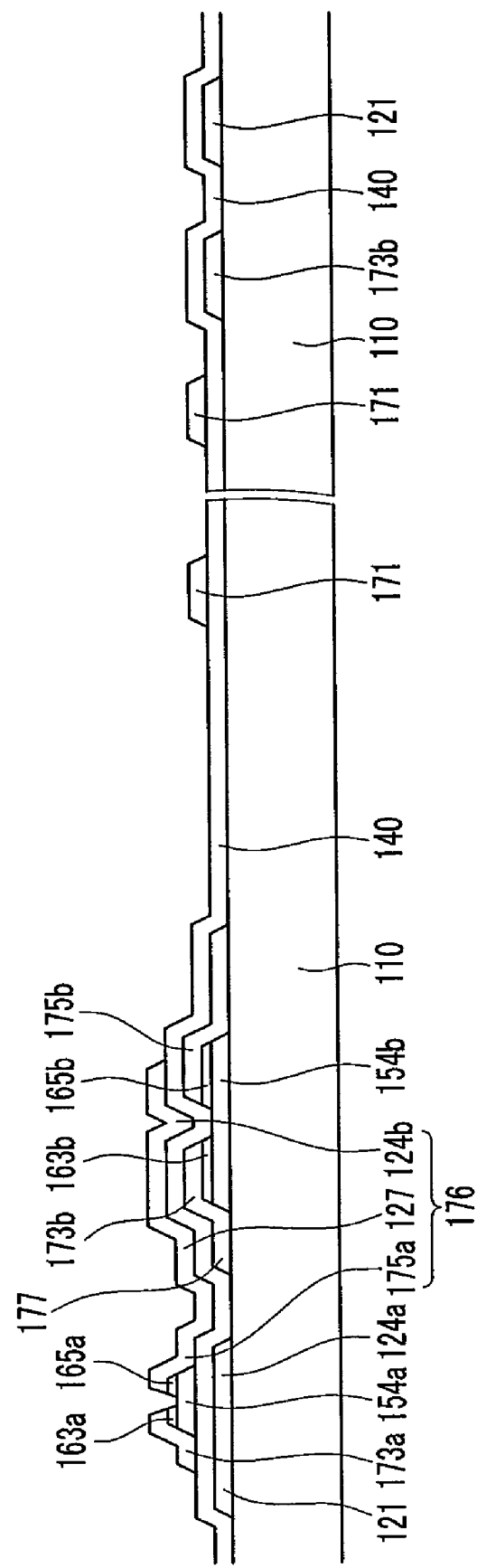

Referring to FIG. 7, a metal layer is deposited on the gate insulating layer 140 and the ohmic contact layers 164a, and is patterned by photolithography to form a plurality of data lines 171 including a plurality of switching input electrodes 173a, and a plurality of electrode members 176 including a plurality of switching output electrodes 175a, a plurality of low storage electrodes 127, and a plurality of driving control electrodes 124b.

Next, the ohmic contact layers 164a are etched by using the switching input electrodes 173a and the switching output electrodes 175a as an etch mask to form a plurality of pairs of ohmic contacts 163a and 165a.

Figure 8:
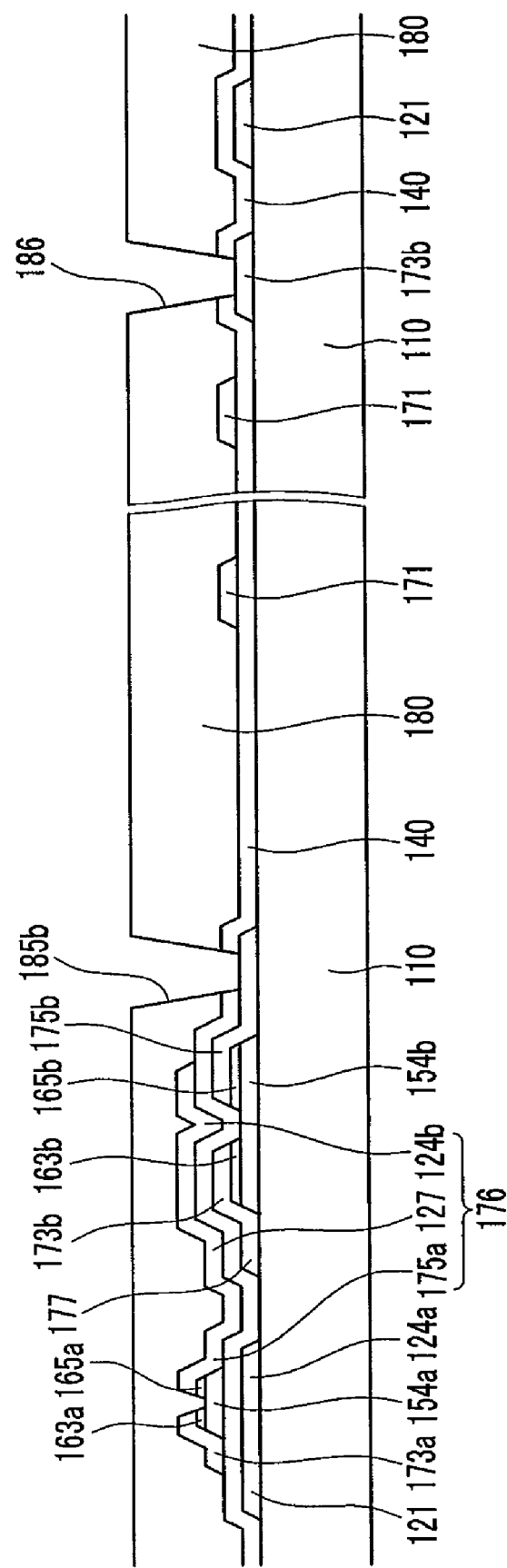

Next, referring to FIG. 8, a passivation layer 180 made of an organic material is coated on the whole surface of the substrate 110 including the data lines 171, the electrode members 176, and the gate insulating layer, and the passivation layer 180 and the gate insulating layer 140 are patterned by photolithography to form a plurality of contact holes 185b and 186.

Figure 9:
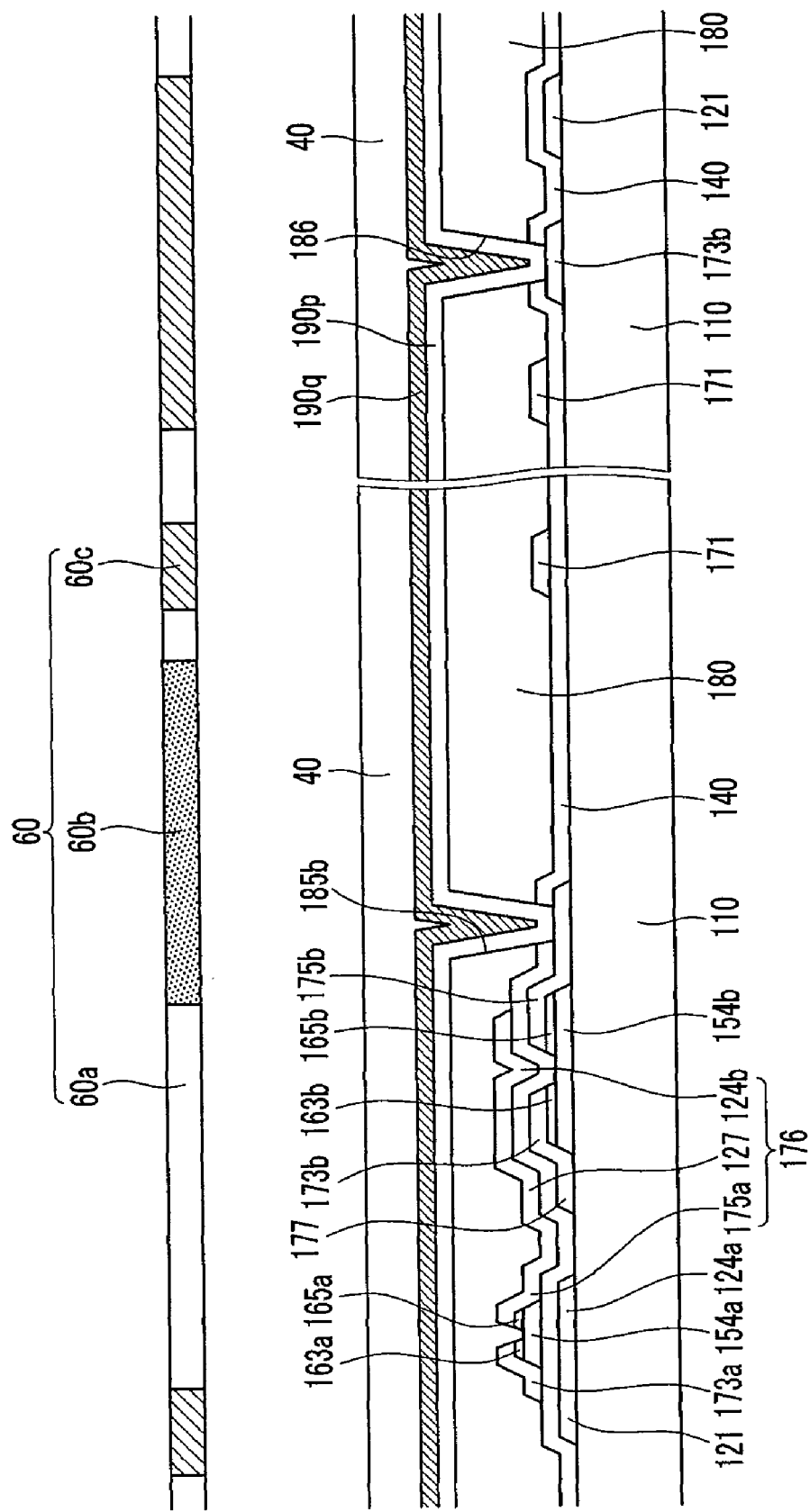

Next, referring to FIG. 9, an ITO layer 190p and a metal layer of a lower resistance 190q are sequentially deposited on the passivation layer 180, and a photosensitive film 40 is coated thereon.

Next, an exposure mask 60 is aligned on the photosensitive film 40 and exposes the photosensitive film 40. Here, the exposure mask 60 includes a light transmission region 60a, a light blocking region 60c, and a semi-light transmission (translucent) region 60b. The semi-light transmission region 60b includes a slit pattern, a lattice pattern, or a thin film having a middle transmittance or a middle thickness. When using the slit pattern, the width of the slits or the interval between the slits is less than the resolution of the light exposer used in the photolithography process.

Figure 10:
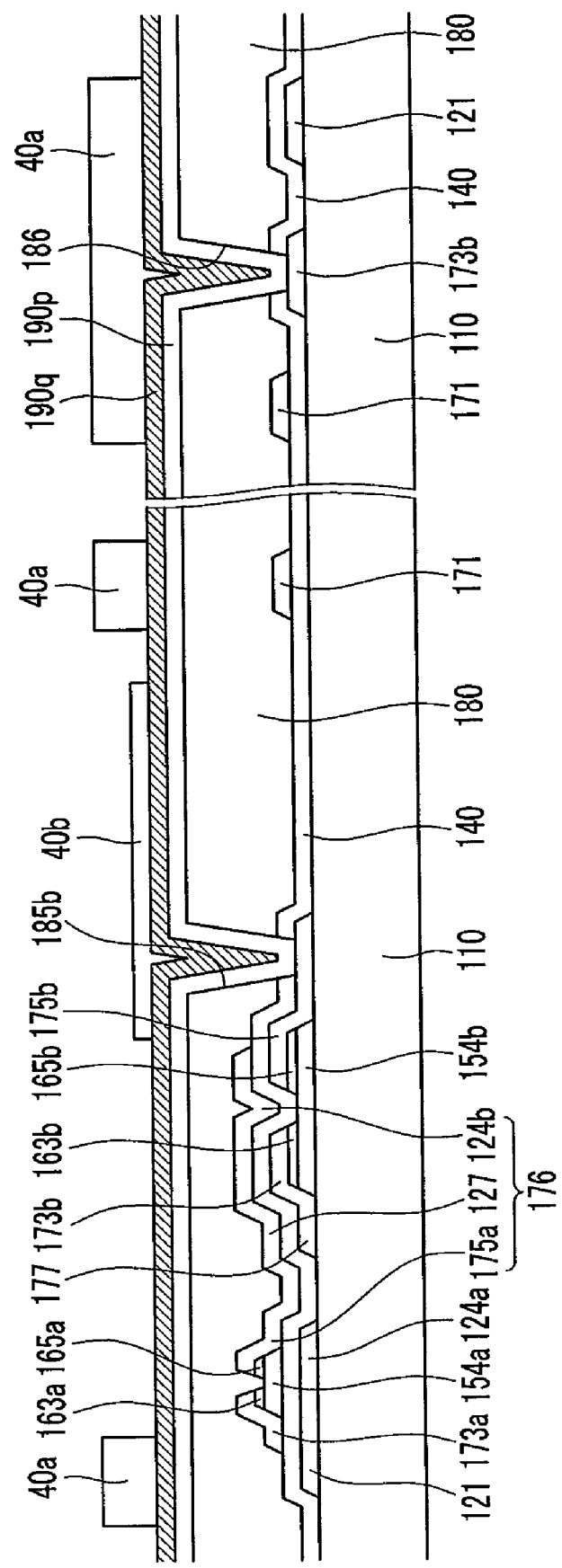

Next, the exposure mask 60 is removed, and the exposed photosensitive film 40 is developed to form a photoresist pattern 40a having a first thickness and a photoresist pattern 40b having a second thickness that is less than the first thickness, as shown in FIG. 10. A ratio between the first thickness and the second thickness may be changed according to the process conditions, but it is preferable that the second thickness is less than half of the first thickness.

Figure 11:
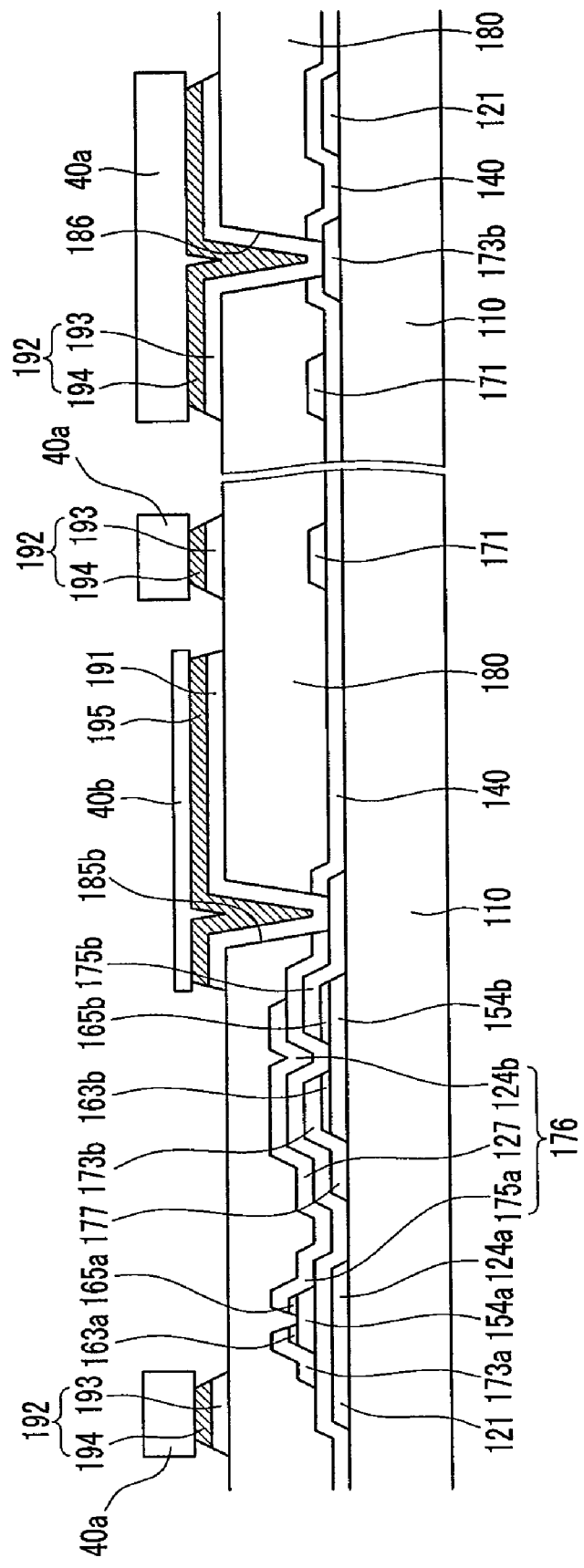

Next, the low resistance metal layer 190q and the ITO layer 190p are etched by using the photoresist patterns 40a and 40b as an etch mask to form a plurality of driving voltage lines 192 including the lower layer 193 and the upper layer 194, and a plurality of pixel electrodes 191 including a lower pixel electrode layer 191 and an upper pixel electrode layer 195, as shown in FIG. 11.

Figure 12:
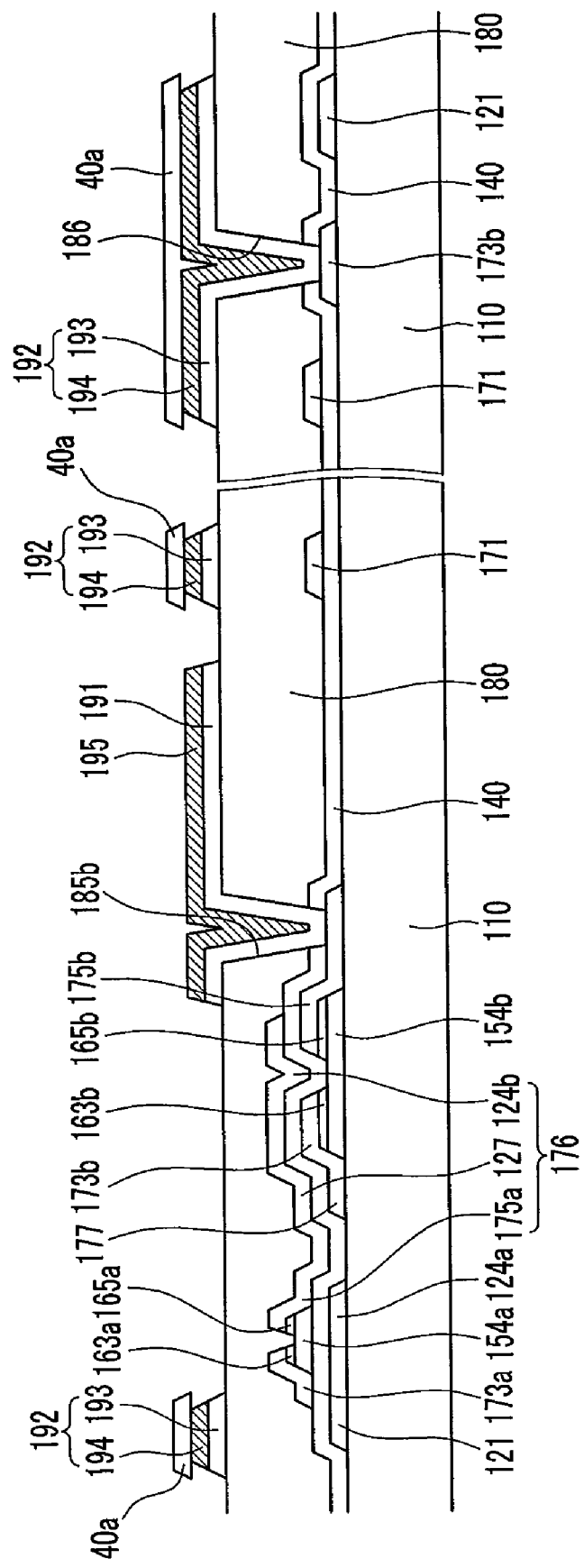

Next, referring to FIG. 12, the photoresist pattern 40b having the second thickness is removed by using an etch back process such as ashing. The first thickness of the photoresist pattern 40a is reduced by some degree. The upper pixel electrode layer 195 is exposed through the photoresist pattern 40b having the second thickness.

Figure 13:
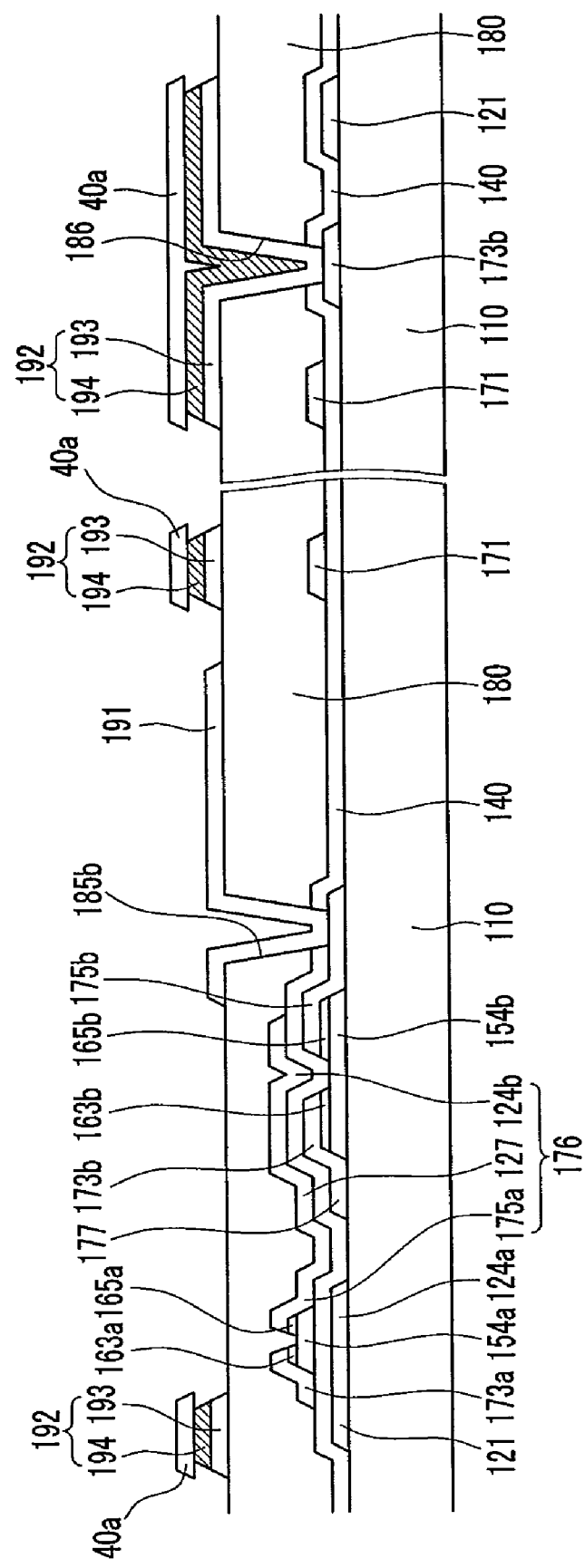

Next, as shown in FIG. 13, the exposed upper pixel electrode layer 195 is etched by using an etchant for the metal to expose the lower pixel electrode layer 191. Here, the metal etchant has etch selectivity between the ITO layer and the metal layer such that the lower pixel electrode layer 191 made of ITO is not etched.

Figure 14:
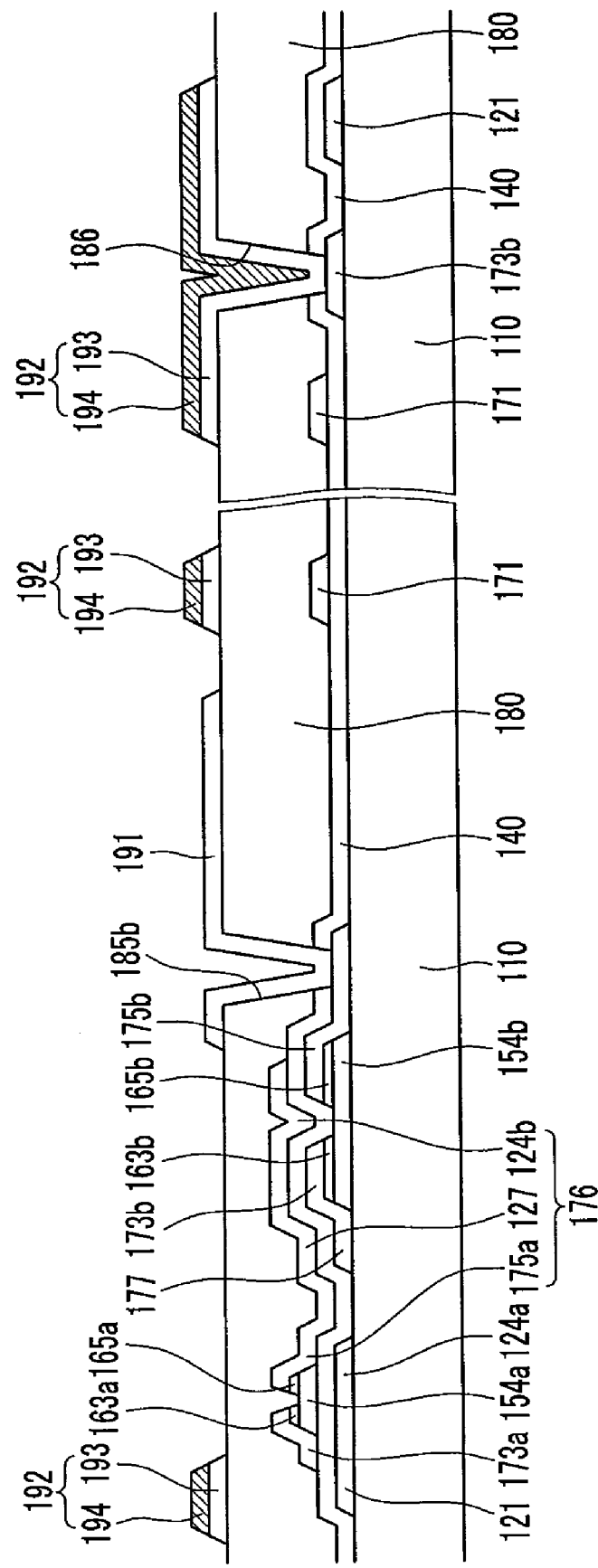

Next, referring to FIG. 14, the photoresist pattern 40a is removed such that the driving voltage lines 192 including the lower layer 193 and the upper layer 194, and the pixel electrodes 191, are completed.

Next, as shown in FIG. 2 and FIG. 3, an insulating layer 361 made of an organic material is coated on the driving voltage lines 192, the pixel electrodes 191, and the passivation layer 180, and is exposed and developed to form a plurality of openings 365 exposing the pixel electrodes 191.

Next, a plurality of organic light emitting members 370 are formed in the openings 365, and a common electrode 270 is formed on the insulating layer 361 and the organic light emitting member 370.

In the present exemplary embodiment, the driving voltage lines 192 include the ITO layer and the low resistance metal layer that are sequentially deposited, but it is not limited thereto, and a structure in which the low resistance metal layer and the ITO layer are sequentially deposited may alternatively be used. In this case, the low resistance metal is deposited on the passivation layer 180, and is patterned by photolithography to only maintain the metal pattern on a portion corresponding to the driving voltage line 192. Next, an ITO layer is deposited on the metal pattern and the passivation layer 180, and is pattered by photolithography to maintain ITO patterns on the metal pattern and the portions where the pixel electrodes 191 will be formed on the passivation layer 180 such that the driving voltage lines 192 of a double-layered structure, and the passivation layer 180 and the pixel electrodes 191 are completed.

Also, as in a small display device, in the case in which the driving voltage lines 192 do not include the low resistance metal layer, only an ITO layer may be deposited on the passivation layer 180 and patterned by photolithography to form the driving voltage lines 192 and the pixel electrodes 191 with a single-layered structure.

Also, as in the top emission type, when the pixel electrodes 191 are formed of an opaque metal layer, a low resistance metal layer may be deposited on the passivation layer 180 and patterned by photolithography to form the driving voltage lines 192 and the pixel electrodes 191 with the single-layered structure.

Exemplary Embodiment 2

Now, an OLED display according to another exemplary embodiment of the present invention will be described in detail with reference to FIG. 15 and FIG. 16 as well as FIG. 1.

Figure 15:
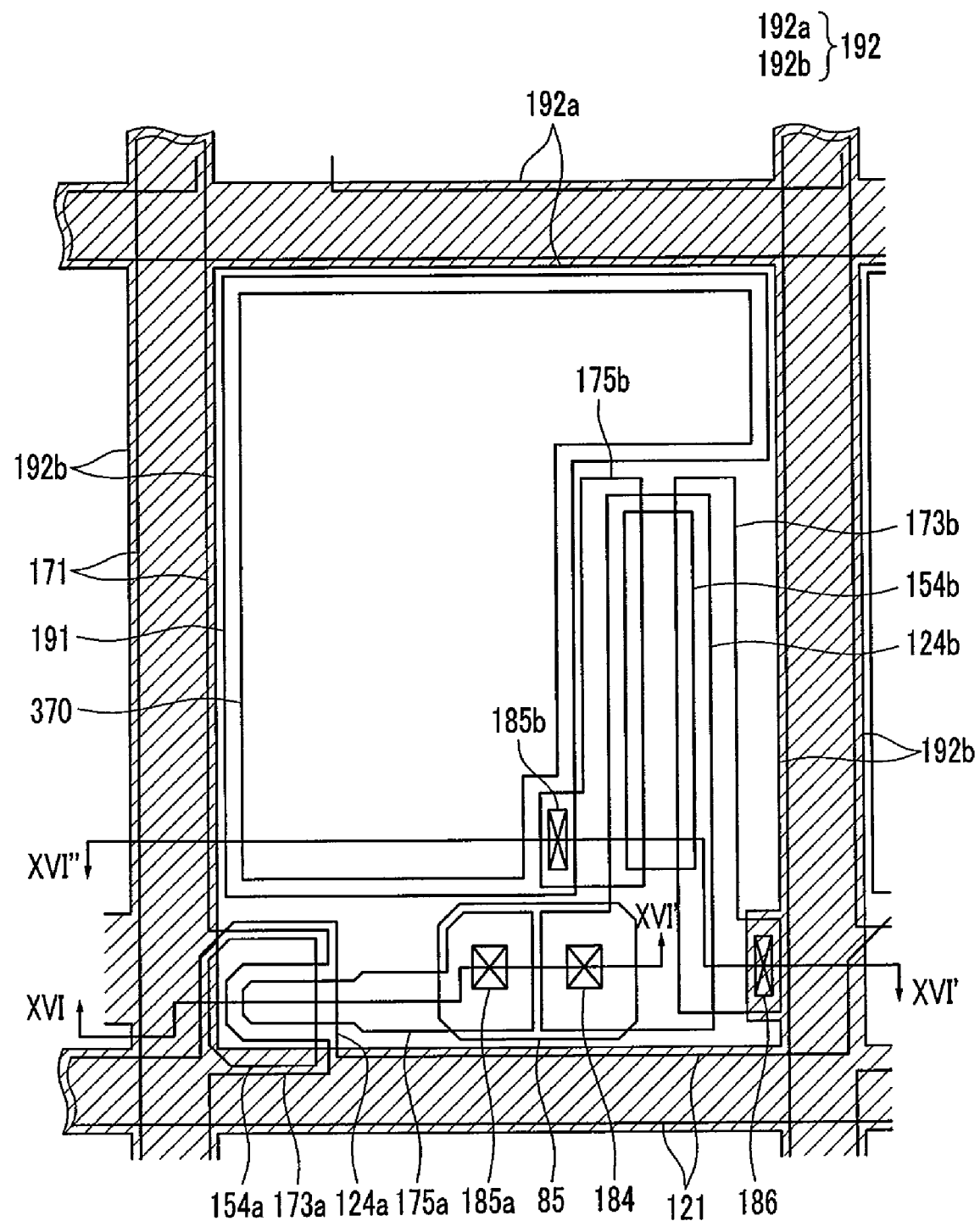
FIG. 15 is a layout view of an OLED display according to another exemplary embodiment of the present invention.
Figure 16:
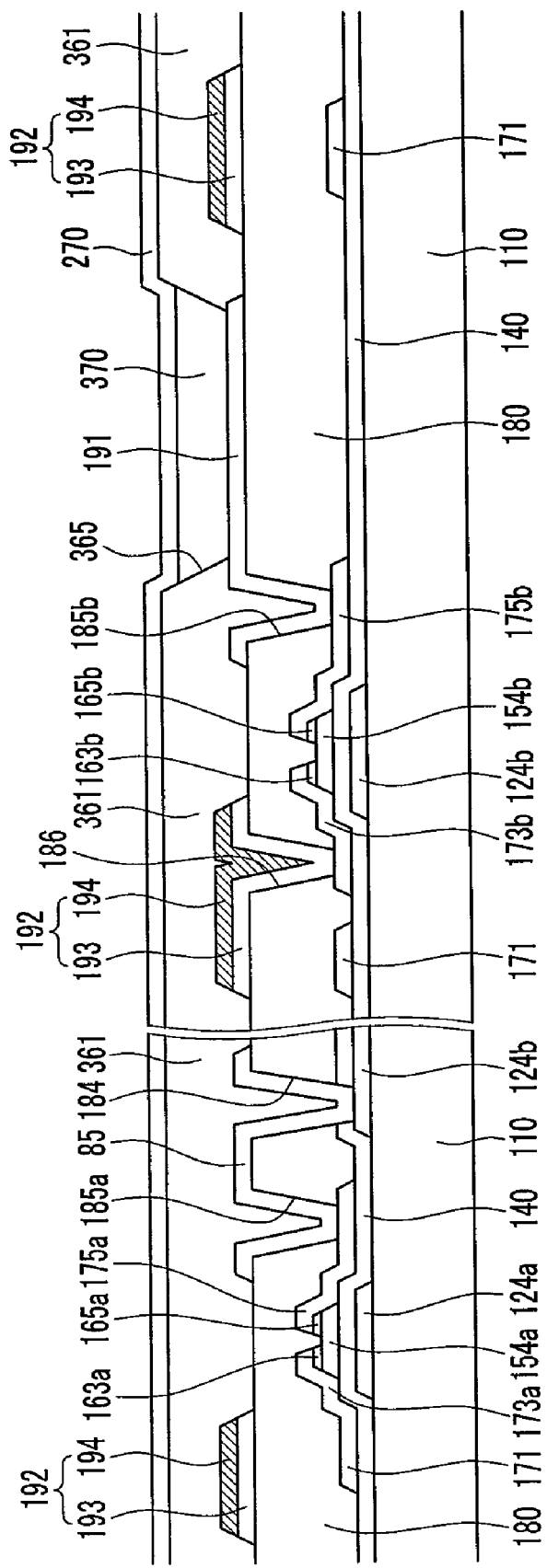
FIG. 16 is a cross-sectional view of the OLED display shown in FIG. 15 taken the line XVI-XVI'-XVI"

FIG. 15 is a layout view of an OLED display according to another exemplary embodiment of the present invention, and FIG. 16 is a cross-sectional view of the organic light emitting device shown in FIG. 15 taken along line XVI-XVI'-XVI".

The present exemplary embodiment relates to an OLED display including a switching thin film transistor and a driving thin film transistor of a bottom gate structure, differently from the previous exemplary embodiment, and will now be described. Descriptions overlapping those of the previously described exemplary embodiment are omitted, and the same constituent elements are indicated by the same reference numerals.

A plurality of gate lines 121 including a plurality of switching control electrodes 124a and a plurality of driving control electrodes 124b are formed on an insulating substrate 110, and a gate insulating layer 140 is formed on the gate lines 121 and the driving control electrodes 124b.

A plurality of switching semiconductors 154a overlapping the switching control electrodes 124a and a plurality of driving semiconductors 154b overlapping the driving control electrodes 124b are respectively formed on the gate insulating layer 140. The switching semiconductors 154a and the driving semiconductors 154b may be formed of amorphous silicon, microcrystalline silicon, or polysilicon.

A plurality of data lines 171 including a plurality of switching input electrodes 173a, a plurality of switching output electrodes 175a, a plurality of driving input electrodes 173b, and a plurality of driving output electrodes 175b are formed on the switching semiconductors 154a and the driving semiconductors 154b.

The switching input electrodes 173a and the switching output electrodes 175a are opposite to each other on the switching semiconductors 154a, and the driving input electrodes 173b and the driving output electrodes 175b are opposite to each other on the driving semiconductors 154b.

A plurality of pairs of ohmic contacts 163a and 165a, and 165a and 165b, are formed between the switching semiconductors 154a and the switching input electrodes 173a, the switching semiconductors 154a and the switching output electrodes 175a, the driving semiconductors 154b and the driving input electrodes 173b, and the driving semiconductors 154b and the driving output electrodes 175b, respectively.

A passivation layer 180 having a plurality of contact holes 185a, 184, 186, and 185b are formed on the data lines 171, the switching output electrodes 175a, the driving input electrodes 173b, and the driving output electrodes 175b. The contact holes 185a, 184, 186, and 185b respectively expose the switching output electrodes 175a, the driving control electrodes 124b, the driving input electrodes 173b, and the driving output electrodes 175b.

A plurality of pixel electrodes 191, a plurality of connecting members 85, and a plurality of driving voltage lines 192 are formed on the passivation layer 180.

The pixel electrodes 191 are connected to the driving output electrodes 175b through the contact holes 185b, and the connecting members 85 are connected to the switching output electrodes 175a and the driving control electrodes 124b through the contact holes 185a and 184 for connecting to each other.

The driving voltage lines 192 include horizontal portions 192a extended along the gate lines 121 and overlapping the gate lines 121, and vertical portions 192b extended along the data lines 171 and overlapping the data lines 171, and the plurality of horizontal portions 192a and the plurality of vertical portions 192b are intersected to thereby form a mesh shape. The driving voltage lines 192 including the horizontal portions 192a and the vertical portions 192b are hatched in the drawing.

The driving voltage lines 192 are connected to the driving input electrodes 173b through the contact holes 186.

The pixel electrodes 191 and the connecting members 85 are made of a single-layered structure of a transparent conductor such as ITO or IZO, and the driving voltage lines 192 are made of a double-layered structure including a lower layer 193 of a transparent conductor and an upper layer 194 made of a low resistance metal. However, the lower layer 193 of the driving voltage lines 192 may be made of a low resistance metal and the upper layer 194 thereof may be made of a transparent conductive material. Also, in the case of a small display device, one layer made of the low resistance metal may be omitted, and one layer made of the transparent conductive material may be omitted in the top emission type.

An insulating layer 361 having a plurality of openings 365 is formed on the pixel electrodes 191, the connecting members 85, and the driving voltage lines 192, and a plurality of organic light emitting members 370 are formed in the openings 365.

A common electrode 270 is formed on the insulating layer 361 and the organic light emitting members 370.

Exemplary Embodiment 3

Now, an OLED display according to another exemplary embodiment of the present invention will be described with reference to FIG. 17 and FIG. 18.

Figure 17:
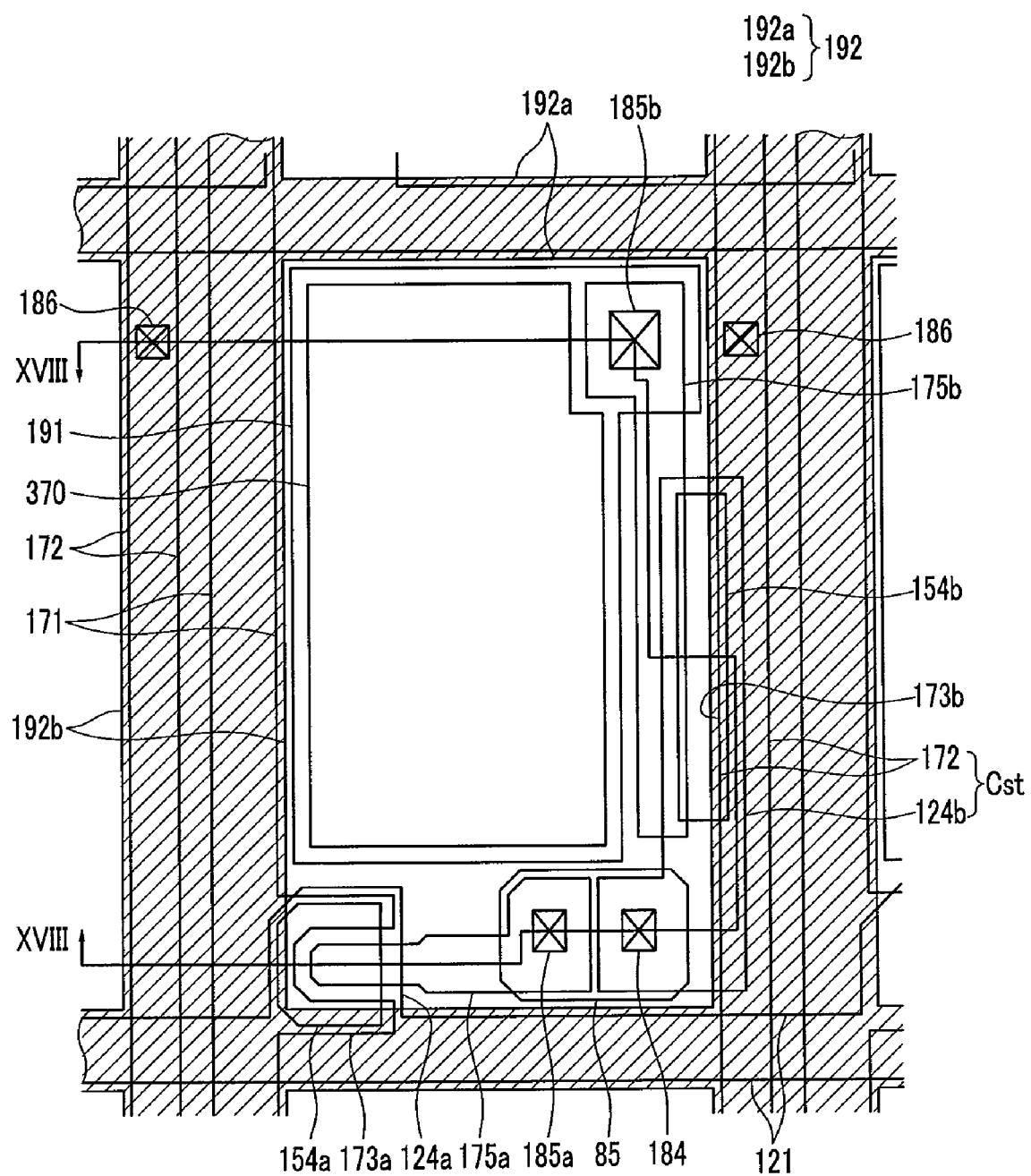
FIG. 17 is a layout view of an OLED display according to another exemplary embodiment of the present invention.
Figure 18:
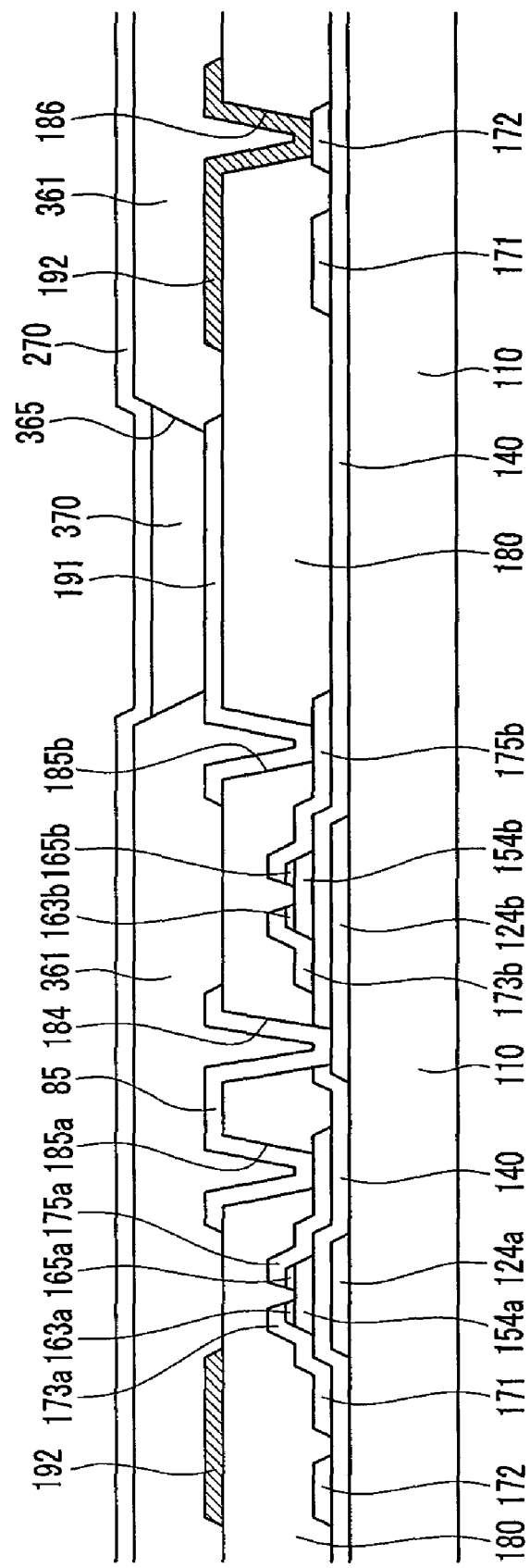
FIG. 18 is a cross-sectional view of the OLED display shown in FIG. 17 taken the line XVIII-XVIII.

FIG. 17 is a layout view of an OLED display according to another exemplary embodiment of the present invention, and FIG. 18 is a cross-sectional view of the OLED display shown in FIG. 17 taken the line XVIII-XVIII.

The present exemplary embodiment further includes a driving voltage line parallel to a data line as well as a driving voltage line formed with the same layer as the pixel electrode, differently from the previous exemplary embodiment. Descriptions overlapping with the above-described exemplary embodiment are omitted, and the same constituent elements are indicated by the same reference numerals.

A plurality of gate lines 121 including a plurality of switching control electrodes 124a and a plurality of driving control electrodes 124b are formed on an insulating substrate 110, and a gate insulating layer 140 is formed on the gate lines 121 and the driving control electrodes 124b.

A plurality of switching semiconductors 154a overlapping the switching control electrodes 124a and a plurality of driving semiconductors 154b overlapping the driving control electrodes 124b are formed on the gate insulating layer 140.

A plurality of data lines 171 including a plurality of switching input electrodes 173a, a plurality of switching output electrodes 175a, a plurality of lower driving voltage lines 172 including a plurality of driving input electrodes 173b, and a plurality of driving output electrodes 175b are formed on the switching semiconductors 154a and the driving semiconductors 154b.

The lower driving voltage lines 172 are extended parallel to the data lines 171, and include the driving input electrodes 173b facing the driving output electrodes 175b on the driving semiconductors 154b. However, the lower driving voltage lines 172 may be formed with the same layer as the gate lines 121 and parallel to the gate lines 121.

The data lines 171, the switching output electrodes 175a, the lower driving voltage lines 172, and the driving output electrodes 175b may be made of a metal having low resistance such as an aluminum-containing metal, a copper-containing metal, or a silver-containing metal.

A plurality of pairs of ohmic contacts 163a and 165a, and 165a and 165b, are formed between the switching semiconductors 154a and the switching input electrodes 173a, the switching semiconductors 154a and the switching output electrodes 175a, the driving semiconductors 154b and the driving input electrodes 173b, and the driving semiconductors 154b and the driving output electrodes 175b, respectively.

A passivation layer 180 having a plurality of contact holes 185a, 184, 186, and 185b is formed on the data lines 171, the switching output electrodes 175a, the lower driving voltage lines 172, and the driving output electrodes 175b. The contact holes 185a, 184, 186, and 185b respectively expose the switching output electrodes 175a, the driving control electrodes 124b, the lower driving voltage lines 172, and the driving output electrodes 175b.

A plurality of pixel electrodes 191, a plurality of connecting members 85, and a plurality of upper driving voltage lines 192 are formed on the passivation layer 180.

The pixel electrodes 191 are connected to the driving output electrodes 175b through the contact holes 185b, and the connecting members 85 are respectively connected to the switching output electrodes 175a and the driving control electrodes 124b through the contact holes 185a and 184 for connection to each other.

As shown in FIG. 17, the upper driving voltage lines 192 include horizontal portions 192a extended along the gate lines 121 and overlapping the gate lines 121, and vertical portions 192b extended along the data lines 171 and the lower driving voltage lines 172 and overlapping the data lines 171 and the lower driving voltage lines 172, and the horizontal portions 192a and the vertical portions 192b intersect each other, thereby forming a mesh shape. In the drawing, the driving voltage lines 192 including the horizontal portions 192a and the vertical portions 192b are hatched.

The upper driving voltage lines 192 are connected to the lower driving voltage lines 172 through the contact holes 186.

The pixel electrodes 191, the connecting members 85, and the upper driving voltage lines 192 are made of a single-layered structure of a transparent conductive material such as ITO or IZO.

An insulating layer 361 having a plurality of openings 365 is formed on the pixel electrodes 191, the connecting members 85, and the upper driving voltage lines 192, and a plurality of organic light emitting members 370 are formed in the openings 365.

A common electrode 270 is formed on the insulating layers 361 and the organic light emitting members 370.

Differently from the above-described exemplary embodiment, the present exemplary embodiment includes two driving voltage lines 172 and 192, and one driving voltage line 172 is formed with the same layer as the gate lines 121 or the data lines 171, and the other driving voltage lines 192 is formed with the same layer as the pixel electrodes 191.

Here, the lower driving voltage lines 172 are formed of the low resistance metal such that the signal delay may be prevented, and the upper driving voltage lines 192 covering the lower driving voltage lines 172, the gate lines 121, and the data lines 171 have a mesh shape such that cross talk in which the pixel electrodes 191 are influenced by the voltages of the gate lines 121 or the data lines 171 may be prevented. Two driving voltage lines 172 and 192 are respectively formed along with the pixel electrodes 191, and the gate lines 121 or the data lines 171, such that the additional process is not necessary.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising:
   a gate line;
   a data line intersecting the gate line;
   a switching thin film transistor connected to the gate line and the data line;
   a driving thin film transistor connected to the switching thin film transistor;
   a first driving voltage line connected to the driving thin film transistor, the first driving voltage line extending and overlapping the gate line in a first direction, and extending and overlapping the data line in a second direction;
   a first electrode connected to the driving thin film transistor;
   a second electrode facing the first electrode; and
   a light emitting member disposed between the first electrode and the second electrode.

2. The OLED display of claim 1, wherein
   the first driving voltage line includes a first layer disposed with the same layer as the first electrode.

3. The OLED display of claim 2, wherein
   the first layer of the first driving voltage line and the first electrode comprise a transparent conductor.

4. The OLED display of claim 3, wherein
the first driving voltage line further includes a second layer disposed on or under the first layer, and comprising a metal.

5. The OLED display of claim 2, further comprising
an organic insulating layer formed between the gate line and data line, and the first driving voltage line.

6. The OLED display of claim 1, further comprising
a second driving voltage line formed with the same layer as at least one of the gate line and the data line, and connected to the first driving voltage line.

7. The OLED display of claim 6, wherein
the first driving voltage line comprises a transparent conductive material and is disposed with the same layer as the first electrode, and
the second driving voltage line comprises a metal.

8. The OLED display of claim 1, wherein
the first driving voltage line includes a pair of horizontal portions and a pair of vertical portion that intersect each other.

9. An OLED display comprising:
a gate line formed on a substrate;
a gate insulating layer formed on the gate line;
a data line formed on the gate insulating layer and intersecting the gate line;
an organic insulating layer formed on the data line;
a first electrode and a first driving voltage line formed on the organic insulating layer, and comprising a transparent conductive layer;
a light emitting member formed on the first electrode; and
a second electrode formed on the light emitting member,
wherein the first driving voltage line overlaps the gate line and the data line.

10. The OLED display of claim 9, wherein
the first driving voltage line further comprises a metal layer formed on or under the transparent conductive layer.

11. The OLED display of claim 9, wherein
the first driving voltage line includes a pair of horizontal portions and a pair of vertical portion that intersect each other.

12. The OLED display of claim 9, further comprising
a second driving voltage line formed with the same layer as at least one of the first signal line and the second signal line, and connected to the first driving voltage line.

13. The OLED display of claim 12, wherein
the second driving voltage line comprises a metal layer.

14. An OLED display comprising:
a first signal line and a second signal line intersecting each other;
a first control electrode connected to the first signal line;
a first semiconductor overlapping the first control electrode;
a first input electrode connected to the second signal line;
a first output electrode facing the first input electrode;
a second control electrode connected to the first output electrode;
a second semiconductor overlapping the second control electrode;
a second input electrode overlapping the second semiconductor;
a second output electrode overlapping the second semiconductor and facing the second input electrode;
a third signal line overlapping the first signal line and the second signal line, and connected to the second input electrode;
a first electrode connected to the second output electrode;
a second electrode facing the first electrode; and
a light emitting member disposed between the first electrode and the second electrode.

15. The OLED display of claim 14, further comprising
an organic insulating layer disposed between the first signal line and second signal line, and the third signal line.

16. The OLED display of claim 15, wherein
the third signal line further comprises a transparent conductive layer formed with the same layer as the first electrode.

17. The OLED display of claim 16, further comprising
a metal layer formed on or under the transparent conductive layer.

18. The OLED display of claim 14, wherein
the first semiconductor and the second semiconductor include different crystalline states.

19. The OLED display of claim 18, wherein
the first semiconductor comprises amorphous silicon, and the second semiconductor comprises crystalline silicon.

20. The OLED display of claim 19, wherein
the first control electrode is disposed under the first semiconductor, and the second control electrode is disposed on the second semiconductor.

* * * * *